(12) United States Patent
Ookubo

(10) Patent No.: US 8,963,655 B2
(45) Date of Patent: Feb. 24, 2015

(54) ACOUSTIC WAVE DEVICE AND METHOD FOR PRODUCING SAME

(75) Inventor: Yoshihiro Ookubo, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 310 days.

(21) Appl. No.: 13/498,815

(22) PCT Filed: Nov. 26, 2010

(86) PCT No.: PCT/JP2010/071154
§ 371 (c)(1),
(2), (4) Date: Mar. 28, 2012

(87) PCT Pub. No.: WO2011/065499
PCT Pub. Date: Jun. 3, 2011

(65) Prior Publication Data
US 2012/0182091 A1    Jul. 19, 2012

(30) Foreign Application Priority Data
Nov. 27, 2009   (JP) ................. 2009-269576

(51) Int. Cl.
*H03H 9/64*     (2006.01)
*B05D 7/22*     (2006.01)
*B05D 3/12*     (2006.01)
*H03H 9/10*     (2006.01)
*H03H 3/08*     (2006.01)
*H03H 9/02*     (2006.01)

(52) U.S. Cl.
CPC ............. *H03H 9/1071* (2013.01); *H03H 3/08* (2013.01); *H03H 9/02629* (2013.01)

USPC .......................................................... 333/193

(58) Field of Classification Search
USPC .................... 333/193, 194, 195, 196
See application file for complete search history.

(56) References Cited

U.S. PATENT DOCUMENTS

2002/0101304 A1    8/2002   Onishi et al.
2003/0034859 A1*   2/2003   Kadota et al. ............... 333/193
2006/0192462 A1    8/2006   Iwamoto et al.

FOREIGN PATENT DOCUMENTS

| JP | H02-305207 A  | 12/1990 |
| JP | 2001-185976 A | 7/2001  |
| JP | 2001-217679 A | 8/2001  |
| JP | 2002-261582 A | 9/2002  |
| JP | 2008-005464 A | 1/2008  |
| WO | 2006/006343 A1| 1/2006  |

OTHER PUBLICATIONS

International Search Report dated Dec. 28, 2010, issued for International Application No. PCT/JP2010/071154.

* cited by examiner

*Primary Examiner* — Stephen E Jones
*Assistant Examiner* — Scott S Outten
(74) *Attorney, Agent, or Firm* — Procopio, Cory, Hargreaves & Savitch LLP

(57) ABSTRACT

An acoustic wave device comprises a substrate and an acoustic wave element on one main surface of the substrate. Side surfaces of the substrate comprises a protruding portion which protrudes out at a side of an another main surface closer than a side with the one main surface side.

13 Claims, 7 Drawing Sheets

ACOUSTIC WAVE DEVICE AND METHOD FOR PRODUCING SAME

TECHNICAL FIELD

The present invention relates to an acoustic wave device such as a surface acoustic wave (SAW) device or a film bulk acoustic resonator (FBAR) or the like and a method of producing the same.

BACKGROUND ART

An acoustic wave device having a substrate and an acoustic wave element provided on a main surface of the substrate is known. Patent literature 1 discloses an acoustic wave device improved in shock resistance by covering side surfaces or a back surface (main surface on the side opposite to the main surface having an acoustic wave element provided thereon) of the substrate by a resin.

An acoustic wave device is sometimes impacted from a side direction of the substrate at the time of transport during the period from manufacture to mounting etc. Note that, Patent Literature 1 refers to the shock resistance, but does not particularly take note of impact from a side direction of the substrate. As a result, the acoustic wave device of Patent Literature 1 is not a particularly preferred aspect against impact from the side direction of a substrate.

Accordingly, it is preferable that an acoustic wave device capable of improving the shock resistance from a side direction of a substrate and a method of production of the same be provided.

Patent literature 1: Japanese Patent Publication (A) No. 2008-5464

SUMMARY OF INVENTION

An acoustic wave device according to an embodiment of the present invention has a substrate and an acoustic wave element on one main surface of the substrate. On the side surface of the substrate, a protruding portion is provided which protrudes out from the side surfaces at a side of the other main surface compared with a side of the one main surface.

A method of production of an acoustic wave device according to an embodiment of the present invention has a first cutting step of cutting a wafer, on one main surface of which a plurality of acoustic wave elements are provided, at the part of that one main surface side by a first blade so as to form groove portions which partition a plurality of acoustic wave devices and a second cutting step of cutting the wafer at the part of the other main surface side along the groove portions by a second blade having a thinner blade thickness than the first blade so as to separate the wafer.

According to the above constitution and procedure, when shock is applied to a side surface of an acoustic wave device at the time of transport etc. of the acoustic wave device, the protruding portion is more easily impacted. On the other hand, for maintaining the performance of the acoustic wave device, rather than maintaining the shape of the part at the other main surface side, maintaining the shape of the part at the one main surface side on which the acoustic wave element is provided is more important. Accordingly, this means that the acoustic wave device is improved in shock resistance from the side direction of the substrate as a whole. Therefore, the maintenance of shape of the acoustic wave element and maintenance of adhesion between the cover and the substrate are improved.

BRIEF DESCRIPTION OF DRAWINGS

[FIG. 4]

[FIG. 5]

[FIG. 6]

[FIG. 7]

DESCRIPTION OF EMBODIMENTS

Below, a SAW device according to an embodiment of the present invention is explained with reference to the drawings. Note that, the drawings used in the following explanation are schematic. Dimensions and ratios etc. on the drawings do not always coincide with the actual ones.

(Constitution of SAW Device)

Figure 1:
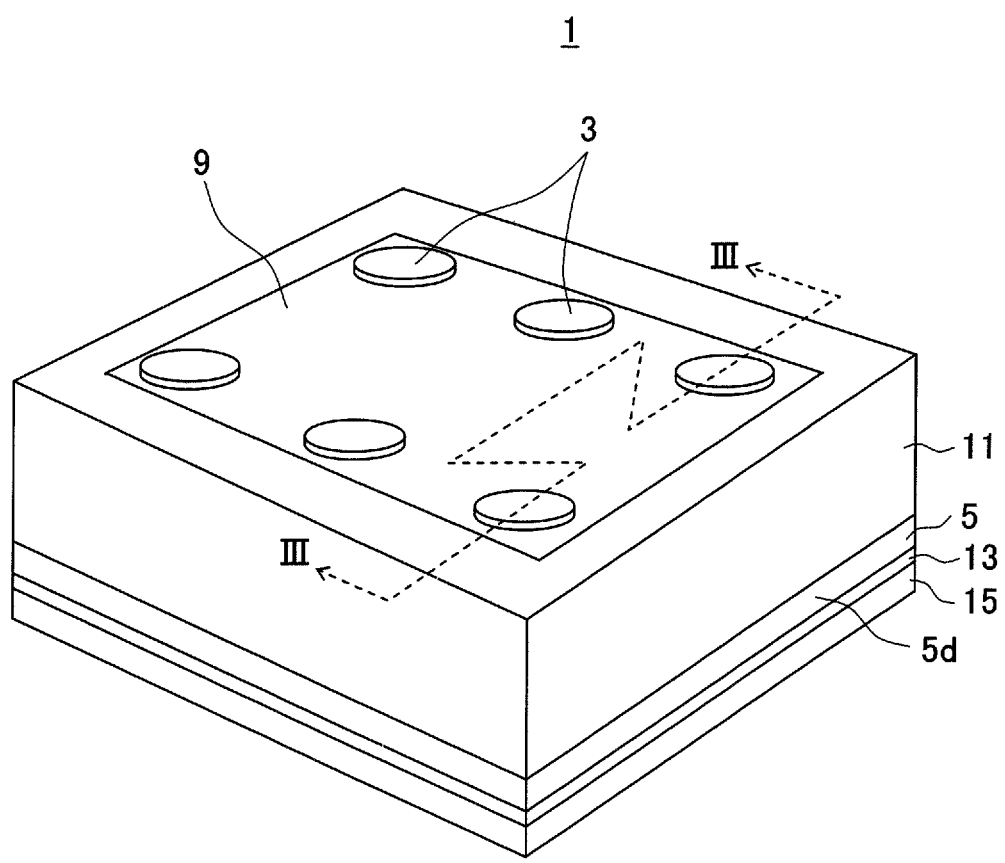
[FIG. 1] A perspective view showing an appearance of a SAW device according to a first embodiment of the present invention.

FIG. 1 is a perspective view of the appearance of a SAW device 1 according to an embodiment of the present invention.

The SAW device 1 is constituted by a so-called wafer level package (WLP) type SAW device. The SAW device 1 is formed in a general block shape as a whole. At one surface of the block, a plurality of terminals 3 are exposed. The number and arrangement positions of the plurality of terminals 3 are suitably set in accordance with the configuration of the electronic circuit inside the SAW device 1. The present embodiment illustrates a case where six terminals 3 are arranged along an outer edge of one surface.

The SAW device 1 receives as input a signal through any of the plurality of terminals 3. The input signal is filtered by the SAW device 1. Then, the SAW device 1 outputs the filtered signal through any of the plurality of terminals 3. The SAW device 1 is for example mounted on the mounting surface of a not shown circuit board or the like with the surface at which the plurality of terminals 3 are exposed made to face that mounting surface and is sealed by a resin in that state. Due to this, it is mounted in a state with the terminals 3 connected to the terminals on the mounting surface.

Figure 2:
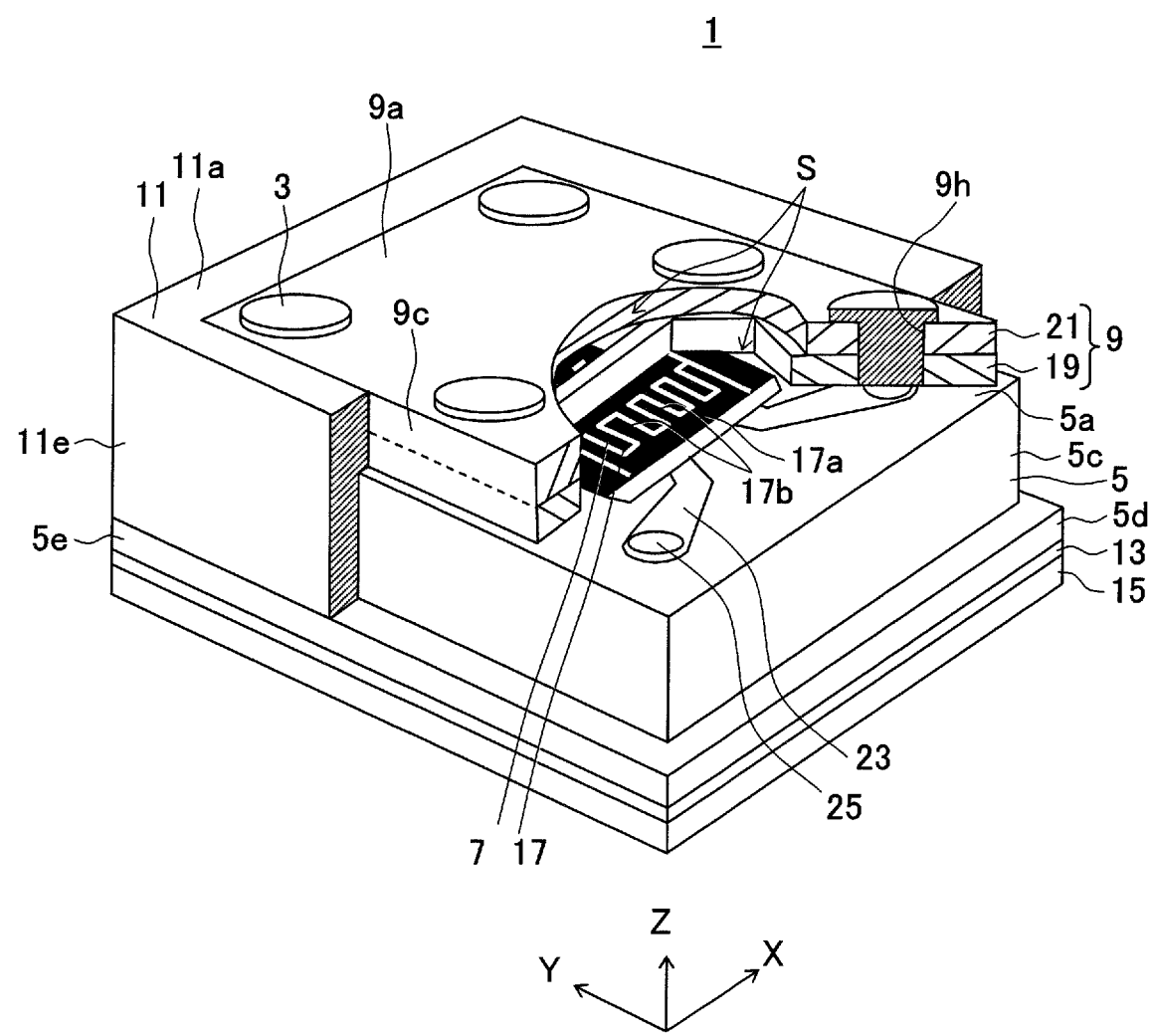
[FIG. 2] A perspective view schematically showing the SAW device of FIG. 1 partially cut away.
Figure 3:
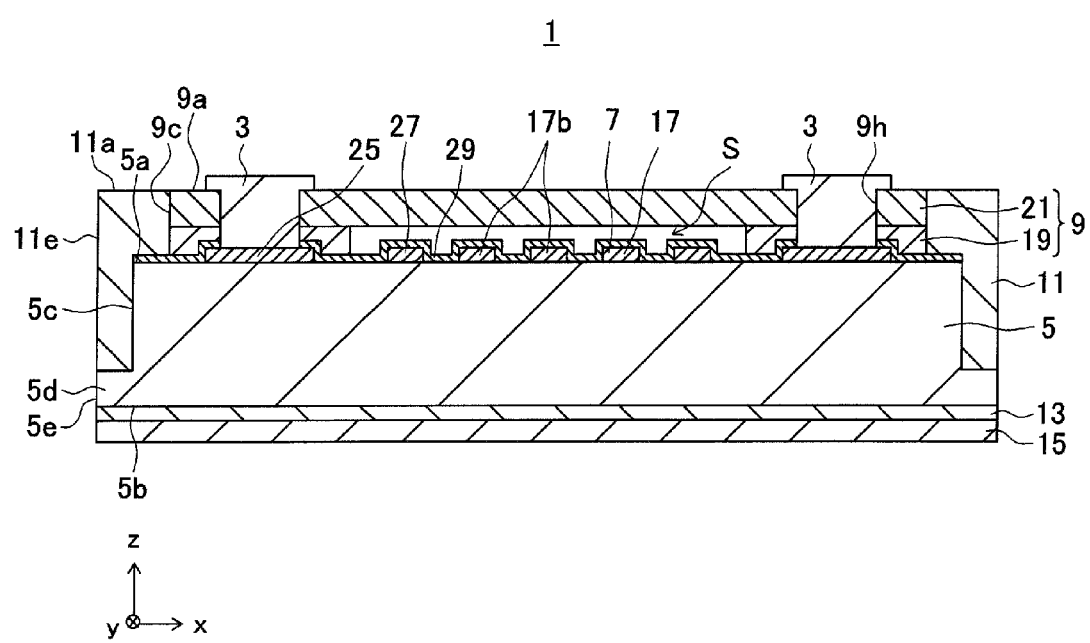
[FIG. 3] A conceptual cross-sectional view along the line III-III in FIG. 1.

FIG. 2 is a perspective view showing the SAW device 1 partially cut away. Further, FIG. 3 is a cross-sectional view taken along the line III-III in FIG. 1.

The SAW device 1 has a substrate 5 and SAW elements 7 provided on the substrate 5. Further, for the purpose of protection etc. of the SAW elements 7, the SAW device 1 has a cover 9 covering the SAW elements 7, a resin film 11 covering side surfaces of the substrate 5, a back surface electrode 13 provided on the substrate 5 at the side opposite to the SAW element 7 side, and a resin layer 15 laminated on the back surface electrode 13.

The substrate 5 is constituted by a piezoelectric substrate. Specifically, for example, the substrate 5 is a single crystal substrate having a piezoelectric property such as a lithium tantalite single crystal, lithium niobate single crystal, or the like. The substrate 5 is generally formed in a thin block shape and has a first main surface $5a$, a second main surface $5b$ (FIG.

3) on the back surface side of the same, and side surfaces 5c facing the sides (outer circumference side) of the first main surface 5a and second main surface 5b. On the side surfaces 5c, a protruding portion 5d protruding outward from the side surfaces 5c is formed.

The protruding portion 5d is provided along the outer circumference of the second main surface 5b over the entire outer circumference. In other words, it is also possible to grasp that the protruding portion 5d is formed by the side surfaces 5c being expanded at the parts at the second main surface 5b sides and possible to grasp that it is formed by parts which remain without being cut away when cutting away the piezoelectric substrate 3 at the first main surface 5a side over the entire outer circumference. The cross-sectional shape (cross-sectional shape shown in FIG. 3) of the protruding portion 5d is generally rectangular. Further, the protruding portion 5d is provided in a "second region" when equally dividing the side surfaces 5c in the vertical direction into two into a first region (region on first main surface 5a side) and a second region (region on second main surface 5b side).

The length of one side of the substrate 5 is for example 0.5 mm to 2 mm. The thickness of the substrate 5 is for example 0.2 mm to 0.5 mm. The amount of protrusion of the protruding portion 5d is for example 5 to 10 μm. The thickness of the protruding portion 5d is for example 25 to 50 μm.

Each SAW element 7 is an element for filtering a signal which is input to the SAW device 1. The SAW element 7 is provided on the first main surface 5a. The SAW element 7 has a pair of comb-shaped electrodes (IDT electrodes) 17. Each comb-shaped electrode 17 has a bus bar 17a (FIG. 2) extending in the propagation direction (X-direction) of the SAW in the substrate 5 and a plurality of electrode fingers 17b extending from the bus bar 17a in a direction (Y-direction) perpendicular to the above propagation direction. The comb-shaped electrodes 17 are provided so that their electrode fingers 17b mesh with each other.

Note that, FIG. 2 and FIG. 3 are schematic views, so show one pair of comb-shaped electrodes 17 each having several electrode fingers 17b. In actuality, two or more pairs of comb-shaped electrodes each having a number of electrode fingers larger than this may be provided. Further, a ladder type SAW filter, double mode SAW resonator filter, or the like may be constituted by a plurality of SAW elements 7 connected in serial connection, parallel connection, or other method. The SAW elements 7 are formed by for example Al alloy such as Al—Cu alloy or the like.

The cover 9 has a frame 19 surrounding the SAW elements 7 in a plan view of the first main surface 5a and has a lid 21 closing the opening of the frame 19. Further, the spaces surrounded by the first main surface 5a (strictly speaking, a protective film 29 which is explained later), frame 19, and lid 21 form vibration spaces S for facilitating the propagation of the SAW. Note that, the vibration spaces S may be provided in suitable numbers and shapes. The present application illustrates a case where two vibration spaces S are provided.

The frame 19 is comprised of a layer having a generally constant thickness in which one or more openings which become vibration spaces S are formed. In the present embodiment, two vibration spaces S are provided. The thickness of the frame 19 (height of the vibration spaces S) is for example several μm to 30 μm. The lid 21 is constituted by a layer having a generally constant thickness which is laminated on the frame 19. The thickness of the lid 21 is for example several μm to 30 μm.

The planar shape of the cover 9 is similar to the planar shape of the substrate 5 and is rectangular in the present embodiment. The cover 9 has for example a generally equivalent area with the first main surface 5a and covers generally the entire surface of the first main surface 5a. However, the cover 9 is a bit smaller than the first main surface 5a, so steps is formed between the side surfaces 5c and the side surfaces 9c of the cover 9. The steps is formed over the entire circumference of the first main surface 5a. The size of the steps is for example 5 to 20 μm.

The frame 19 and lid 21 are formed by for example a photosensitive resin. The photosensitive resin is for example a urethane acrylate-based, polyester acrylate-based, or epoxy acrylate-based resin which is cured by radical polymerization of acryl groups, methacryl groups, or the like.

The frame 19 and lid 21 may be formed by the same material or may be formed by materials different from each other. In the present example, for convenience of explanation, the borderline between the frame 19 and the lid 21 is clearly indicated. However, in an actual product, the frame 19 and lid 21 may be formed by the same material and formed integrally as well.

The resin film 11 covers the side surfaces 5c at the parts at the first main surface 5a side other than the protruding portion 5d and the side surfaces 9c of the cover 9. The resin film 11 is provided so as to bury the steps caused by the protruding portion 5d and the step between the substrate 5 and the cover 9 so that the outer shape of the SAW device 1 constituted by the substrate 5, cover 9, and resin film 11 becomes a block shape. That is, the resin film 11 covers the entire surfaces of the side surfaces 5c at the parts at the first main surface 5a side other than the protruding portion 5d and the entire surfaces of the side surfaces 9c. Further, outer circumferential surface 11e of the resin film 11 is flush with the top face 5e of the protruding portion 5d, and end surface 11a of the resin film 11 on the first main surface 5a side is flush with the top face 9a of the cover 9.

The resin film 11 is formed by for example a novolac-based resin, epoxy resin, Biphenol resin, or polyimide resin. The resin film 11 has a lower Young's modulus than the substrate 5. That is, the resin film 11 is softer than the substrate 5 and easily absorbs shock.

The back surface electrode 13 covers the entire surface of the second main surface 5b. The thickness of the back surface electrode 13 is for example 1 μm to several μm. The back surface electrode 13 is formed by for example an Al alloy such as an Al—Cu alloy or the like. The charges formed in the substrate 5 due to temperature change etc. flow to the back surface electrode 13, whereby pyroelectric breakdown of the SAW elements 7 is suppressed.

The resin layer 15 covers the entire surface of the second main surface 5b (back surface electrode 13). The thickness of the resin layer 15 is for example 25 μm to 50 μm. The resin layer 15 is formed by for example a thermosetting resin such as an epoxy resin or the like. The resin layer 15 has a lower Young's modulus than the substrate 5 in the same way as the resin film 11.

The terminals 3 are formed standing at the first main surface 5a and are exposed at the upper surface 9a of the cover 9 through holes 9h formed in the cover 9. Specifically, the holes 9h penetrate through the frame 19 and lid 21 in directions facing the first main surface 5a at the outsides of the vibration spaces S.

The first main surface 5a is provided with lines 23 (FIG. 2) connected to the SAW elements 7 and a plurality of pads 25 connected to the lines 23. The terminals 3 are connected to the SAW elements 7 by being provided on the pads 25.

As shown in FIG. 3, on the first main surface 5a, a conductive layer 27 and a protective film 29 covering the conductive layer 27 are provided.

The conductive layer 27 forms the SAW elements 7, at least a part of the lines 23 (FIG. 2), and at least a part of the pads 25. The conductive layer 27 is formed by for example an Al alloy such as an Al—Cu alloy or the like. Its thickness is for example 100 to 300 nm.

The protective film 29 contributes to prevention of oxidation etc. of the conductive layer 27. The protective film 29 is formed by for example a material which has an insulating property and has a mass light enough so as not to influence the propagation of the SAW. For example, the protective film 29 is formed by silicon oxide ($SiO_2$ etc.), silicon nitride, silicon or the like. The thickness of the protective film 29 is for example about 1/10 (10 nm to 30 mm) of the thickness of the conductive layer 27 or equal to or more than the thickness of the conductive layer 27 (100 nm to 300 nm).

The protective film 29 is for example provided over generally the entire first main surface 5a, while the cover 9 is laminated over the protective film 29. Further, also the part of the resin film 11 which is on the first main surface 5a is laminated over the protective film 29. On the other hand, at the positions of arrangement of the terminals 3, the protective film 29 is removed so that the pads 25 are exposed from the protective film 29.

Note that, strictly speaking, the cover 9 is not directly provided on the first main surface 5a, but is provided on the protective film 29 or the like. In the present example, even in a case where predetermined members, layers, etc. are indirectly provided on the main surface of the substrate 5 in this way and are not directly provided on the main surface of the substrate 5, it is sometimes expressed so that these predetermined members, layers, etc. are provided on the main surface of the substrate 5. This is true for the word "laminate" as well.

On the first main surface 5a, other than this, an insulation film which is laminated on the conductive layer 27 or protective film 29, another conductive layer which is laminated on the conductive layer 27 with the insulation film interposed therebetween and forms a part of the lines 23, a connection strengthening layer which forms upper layer portions of the pads 25 and strengthens the connection between the pads 25 and the terminals 3, and so on may be provided as well.

(Method of Production of SAW Device)

FIG. 4A to FIG. 6D are cross-sectional views for explaining the method of production of the SAW device 1. The steps are advanced in order from FIG. 4A to FIG. 6D.

The steps explained below are realized in a so-called "wafer process". That is, a mother board (wafer 31) which is later divided to form the substrates 5 is formed with a thin film, processed by photolithography, etc., then is diced to form a large number of SAW devices in parallel.

Note, in FIG. 4A to FIG. 5C, only parts corresponding to one SAW device 1 are shown. Further, in FIG. 6A to FIG. 6D, only parts corresponding to three SAW devices 1 are shown. The conductive layer, insulation layer, etc. change in shapes along with the progress in the process. However, common notations are used before and after the changes. In the same way, notations of the first main surface 5a and second main surface 5b of the substrate 5 are assigned to the first main surface and second main surface of the wafer 31.

Figure 4A:
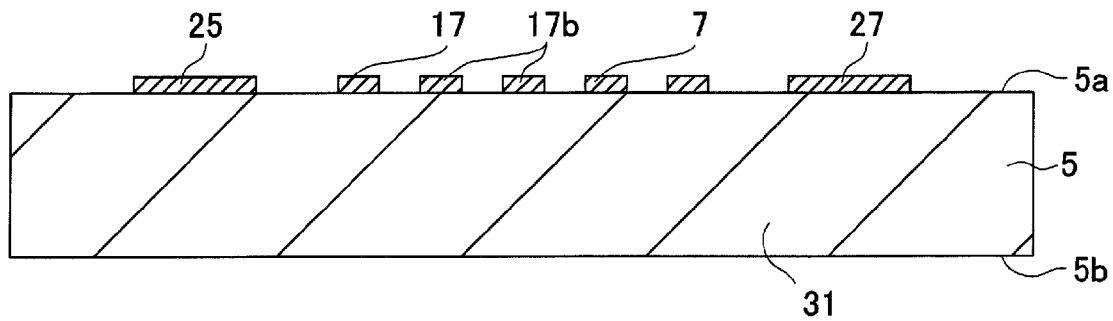
FIG. 4A to FIG. 4D are cross-sectional views for explaining a method of production of the SAW device in FIG. 1.

As shown in FIG. 4A, first, on the first main surface 5a of the substrate 5, a conductive layer 27 is formed. Specifically, first, the thin film forming method such as the sputtering method, vapor deposition method, CVD (chemical vapor deposition) method, or the like is used to form a metal layer which becomes the conductive layer 27 on the first main surface 5a. Next, the metal layer is patterned by photolithography etc. using a reduced protrusion exposure machine (stepper) and RIE (reactive ion etching) device. Therefore, a conductive layer 27 including the SAW elements 7, at least a part of the lines 23, and at least a part of the pads 25 is formed.

Figure 4B:
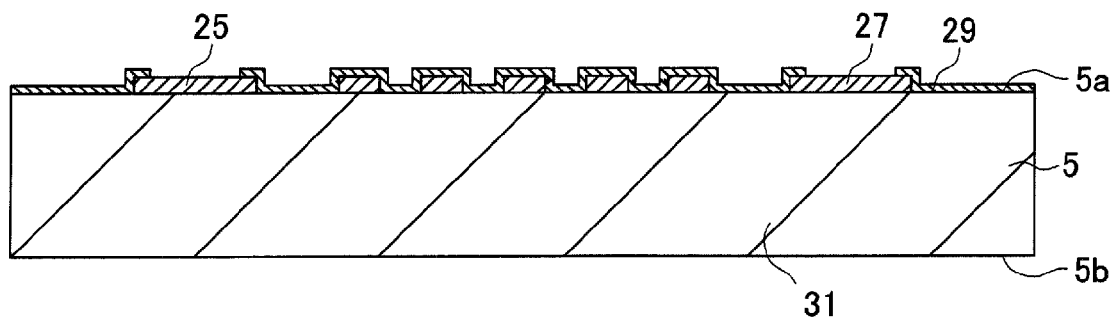

Next, as shown in FIG. 4B, the protective film 29 is formed. Specifically, first, a thin film which becomes the protective film 29 is formed by the thin film forming method such as the CVD method or vapor deposition method or the like. Next, parts of the thin film are removed by the photolithography method so that parts of the conductive layer 27 which constitute the pads 25 are exposed. Accordingly, the protective film 29 is formed.

Figure 4C:
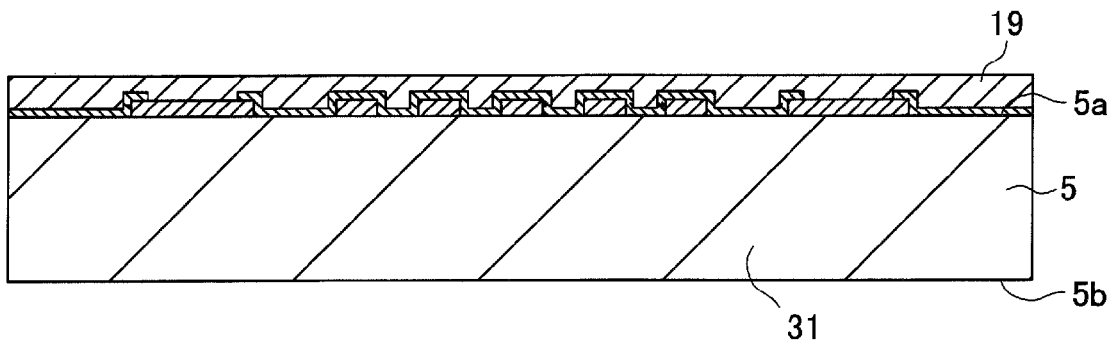

After the protective film 29 is formed, as shown in FIG. 4C, a thin film which becomes the frame 19 is formed. The thin film is formed by for example adhesion of a film formed by a photosensitive resin or a thin film forming method the same as that for the protective film 29 etc.

Figure 4D:
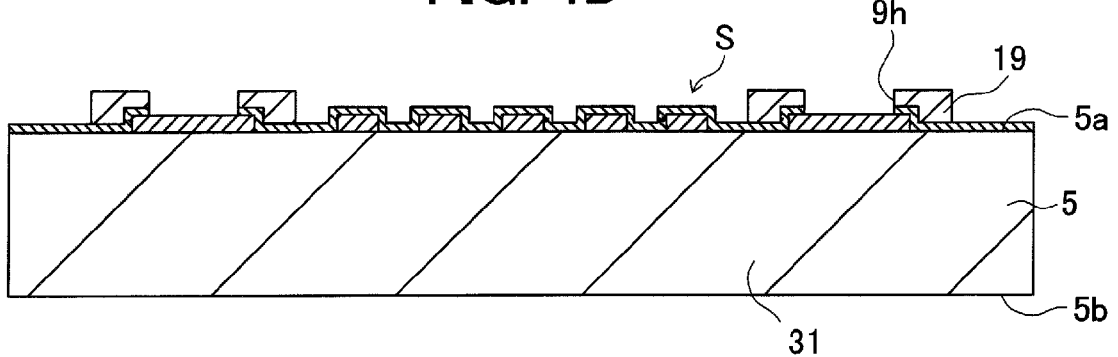

After the thin film which becomes the frame 19 is formed, as shown in FIG. 4D, the photolithography method is used to remove parts of the thin film and form openings which becomes the vibration spaces S and lower side portions of the holes 9h. Further, groove portions are formed along the dicing lines, and side surfaces of the frame 19 are formed as well. That is, the frame 19 is formed from the thin film. Note that, the photolithography may be either of the positive type or the negative type.

Figure 5A:
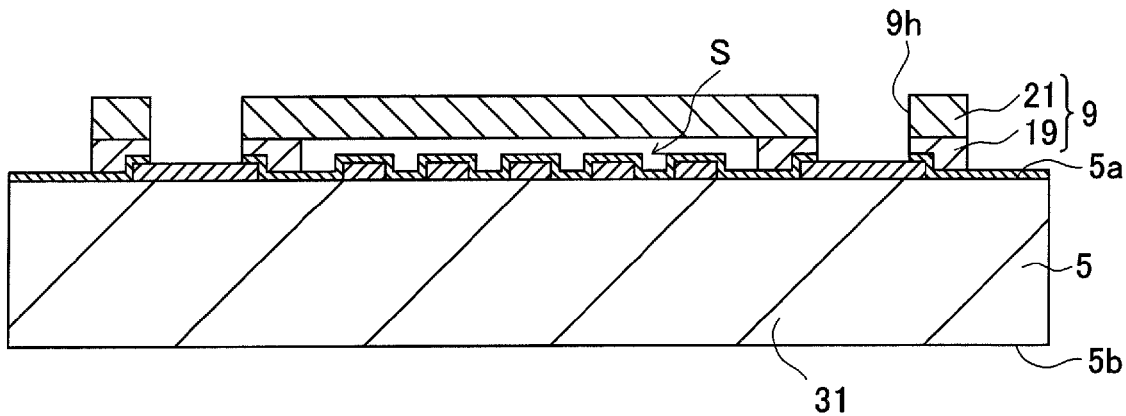
FIG. 5A to FIG. 5C are cross-sectional views showing a continuation of FIG. 4D.
Figure 5B:
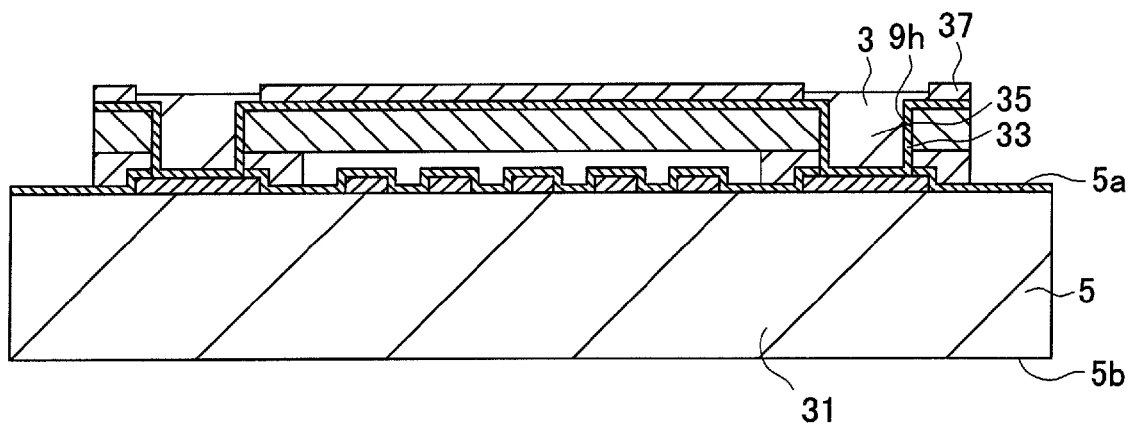

After the frame 19 is formed, as shown in FIG. 5A, the lid 21 is formed by the same method as the method of formation of the frame 19. Specifically, first, a thin film which becomes the lid 21 is formed. The thin film is formed by for example adhesion of a film formed by a photosensitive resin. By laminating the thin film on the frame 19, the openings of the frame 19 are closed, and the vibration spaces S are constituted.

Next, by the photolithography method, parts of the thin film are removed, and upper side portions of the holes 9h are formed. Further, groove portions are formed along the dicing lines, and side surfaces of the frame 19 are formed. That is, the lid 21 is formed from the thin film. Note that, the photolithography may be either of the positive type or negative type.

After the lid 21 is formed, as shown in FIG. 5D, terminals 3 are formed. Specifically, first, a base layer 33 is formed over the upper face 9a of the cover 9 and the inside of the holes 9h. The base layer 33 is a metal layer and is formed by for example the sputtering method.

Next, on the base layer 33, a resist layer 37 is formed. The resist layer 37 is for example formed by having a thin film formed on the substrate by a spin coating method or other technique and having that thin film patterned by the photolithography method. By removal of parts of the thin film by patterning, the base layer 33 is exposed at the holes 9h and their peripheral parts.

After that, the electroplating method is used to cause a metal to deposit on the exposed parts of the base layer 33. Accordingly, solid parts 35 are formed.

Figure 5C:
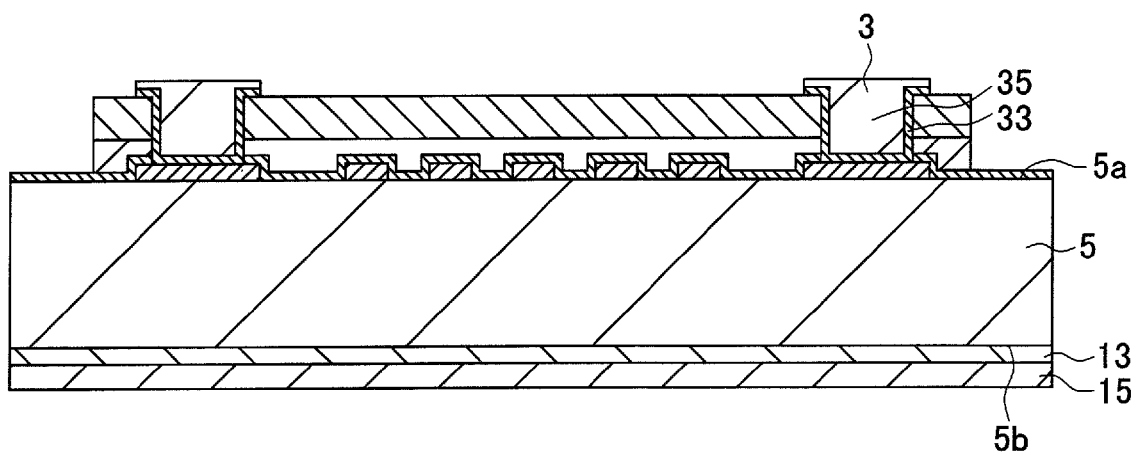

After the solid parts 35 are formed, as shown in FIG. 5C, the parts of the base layer 33 covered by the resist layer 37 and the resist layer 37 are removed. Therefore, the terminals 3 are formed. That is, the surface parts of the terminals 3 are constituted by the base layer 33, and internal parts (majority) of the terminals 3 are constituted by the solid parts 35. Note that, in FIG. 3, illustration of the base layer 33 is omitted.

After that, on the second main surface 5b, the back surface electrode 13 and resin layer 15 are sequentially formed (FIG. 5C). Specifically, the back surface electrode 13 is formed by the thin film forming method such as the sputtering method, vapor deposition method, CVD method, or the like. The resin layer 15 is formed by for example adhering a resin sheet to the back surface electrode 13, and then thermosetting it. Note that, the resin layer 15 may be formed by a potting method or printing method as well.

Figure 6A:
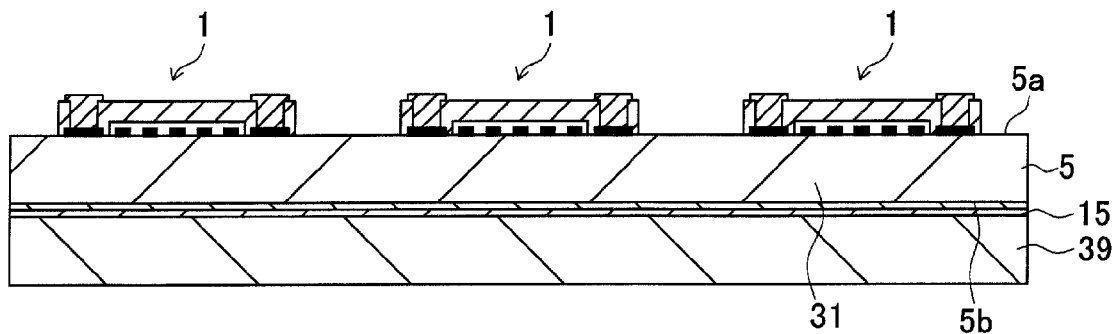
FIG. 6A to FIG. 6D are cross-sectional views showing a continuation of FIG. 5C.

After the resin layer 15 is formed, as shown in FIG. 6A, the resin layer 15 of the wafer state SAW devices 1 and a dicing tape 39 are bonded.

Figure 6B:
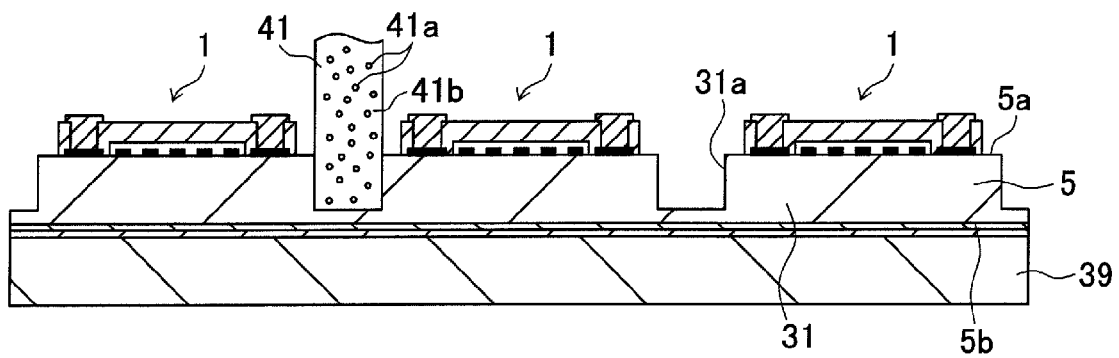
Figure 6C:
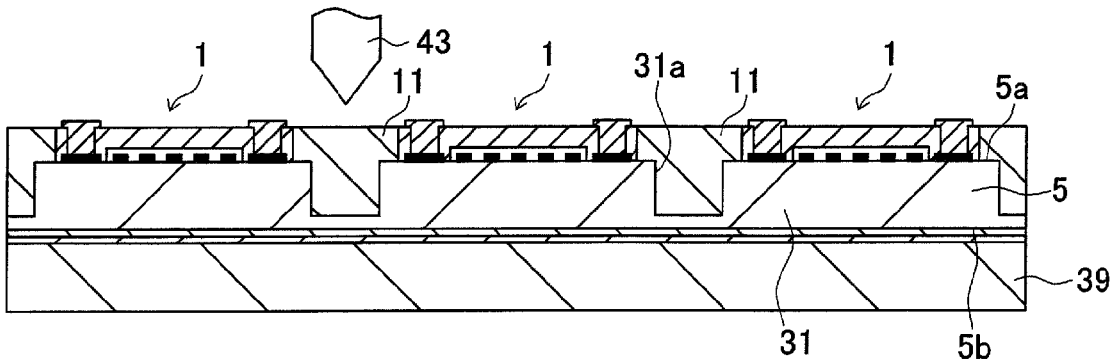
Figure 6D:
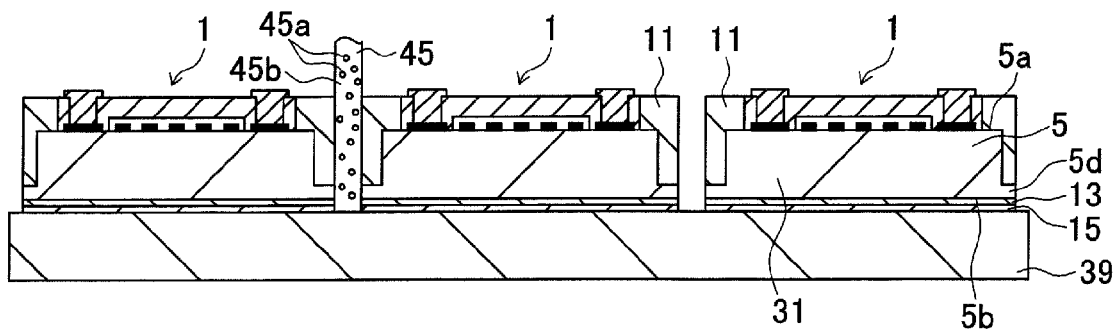

Next, as shown in FIG. 6D, a first blade 41 is used to the portions of the wafer 31 on the first main surface 5a side along the dicing lines. Accordingly, groove portions 31a partitioning a plurality of SAW devices 1 are formed.

After the groove portions 31a are formed, as shown in FIG. 6C, resin constituting the resin film 11 is filled in the groove portions 31a. The resin is filled by using for example a dispenser 43. Further, the filled resin is cured by heating.

After the resin is filled and hardened, as shown in FIG. 6D, a second blade 45 having a thinner blade thickness than the first blade 41 is used to cut the wafer-state SAW devices 1 along the groove portions 31a from the first main surface 5a side. Specifically, the resin filled in the groove portions 31a, parts of the wafer 31 at the second main surface 5b side, the back surface electrode 13, and the resin layer 15 are cut at schematically the center of the groove portions 31a.

Therefore, the plurality of SAW devices 1 are separated from each other. Further, due to the difference of blade thickness between the first blade 41 and the second blade 45, the protruding portions 5d are formed. For example, when the blade thickness of the first blade 41 is 50 μm and the blade thickness of the second blade is 40 μm, the amount of protrusion of the protruding portions 5d is (50−40)/2=5 μm.

Note that, the first blade 41 is for example a fixed abrasive type blade and has a plurality of fixed abrasive grains 41a and a connecting material 41b holding the plurality of fixed abrasive grains 41a. In the same way, the second blade 45 has a plurality of fixed abrasive grains 45a and a connecting material 45b holding the plurality of fixed abrasive grains 45a.

The material of the abrasive grains, particle size, the density of the abrasive grains, the material of the connecting material, and blade thickness may be suitably selected. Part of the conditions other than the blade thickness may be shared between the first blade 41 and the second blade 45. For example, between the first blade 41 and the second blade 45, the material of the abrasive grains, particle size, and the density of abrasive grains are shared, but the type of the connecting material is different. As the connecting material 41b, one suitable for cutting a piezoelectric substrate (substrate 5) is selected, while as the connecting material 45b, one suitable for cutting a resin (at least one of the resin film 11 and resin layer 15) is selected.

According to the above embodiment, each SAW device 1 has a substrate 5 and SAW elements 7 on the first main surface 5a of the substrate 5. On the side surfaces 5c of the substrate 5, a protruding portion 5d is provided at the second main surface 5b side compared with the first main surface 5a.

Accordingly, at the time of transport etc. of the SAW device 1, when shock is applied to a side surface 5c, the protruding portion 5d is more easily impacted than the part of the side surface 5c at the first main surface 5a side. On the other hand, for maintaining the performance of the SAW device 1, rather than maintaining the shape of the part at the second main surface 5b side, maintaining the shape of the part at the first main surface 5a side is more important. Accordingly, this means that the SAW device 1 is improved in shock resistance from the side direction of the substrate 5 as a whole. Specifically, by strengthening of protection of the substrate 5 at the part at the first main surface 5a side against shock from the side, maintenance of the shape of the SAW elements 7 (maintenance of filter precision) and maintenance of adhesion between the cover 9 and the substrate 5 (protective film 29) (antioxidation effect of conductive layer) are improved. Note that, Patent Literature 1 does not disclose the idea of protecting the first main surface 5a side against the impact from the side surface with priority over the second main surface 5b side.

The protruding portion 5d is provided along the outer circumference of the second main surface 5b. Accordingly, it is possible to strengthen the protection of the first main surface 5a side against impact from various directions parallel to the first main surface 5a. Further, as explained with reference to FIG. 6B and FIG. 6D, the protruding portion 5d can be formed by a simple and convenient method of changing the cutting width at the time of dicing, for example, the protruding portion 5d can be formed by using the first blade 41 and second blade 45 having different blade thicknesses.

The SAW device 1 has the resin layer 11 which covers the side surfaces 5c at the parts of the first main surface 5a side other than the protruding portion 5d, abuts against the protruding portion 5d from the first main surface 5a side, and is softer than the substrate 5. Accordingly, due to the resin film 11, shock with respect to a side surface 5c can be absorbed, and protection of the parts of the SAW device 1 at the first main surface 5a side can be strengthened. Note that, a "resin film 11 which is softer than the substrate 5" means "softer" when compared in Young's modulus. That is, the resin film 11 has a smaller Young's modulus than the substrate 5. Further, the protruding portion 5d functions as a stopper which limits movement of the resin film 11 to the second main surface 5b side, whereby peeling of the resin film 11 from the side surfaces 5c is suppressed.

The resin film 11 may also be formed so that its side surfaces are located at the inner side compared with the protruding portion 5d. In other words, the protruding portion 5d may be formed so that it protrudes outward compared with the side surfaces of the resin film 11. Due to this, when an object having a surface parallel to a side surface strikes a SAW device 1 from the side direction of the substrate 5, that object strikes the protruding portion 5d, so propagation of a large impact to the first main surface 5a of the SAW device 1 can be suppressed. On the other hand, when a pointed object that does not contact the protruding portion 5d strikes the SAW device 1 from the side direction of the substrate 5, the shock at the time of impact is eased by the resin film 11, so propagation of a large shock to the first main surface 5a of the SAW device 1 can again be suppressed.

The SAW device 1 has the cover 9 which is provided on the first main surface 5a and seals the SAW elements 7. The side surfaces 9c of the cover 9 form steps by being positioned at the inner sides from the side surfaces 5c of the substrate 5. The resin film 11 is provided so as to straddle the side surfaces 9c of the cover 9 from the side surfaces 5c of the substrate 5 and abuts against the steps from the first main surface 5a side. Accordingly, by covering of mating parts of the cover 9 and substrate 5 (strictly speaking, protective film 29) by the resin film 11, invasion of moisture from the mating parts and peeling of the cover 9 from the substrate 5 are suppressed. Further, the steps formed by the cover 9 and substrate 5 function as stoppers which limit movement of the resin film 11 to the second main surface 5b side, so peeling of the resin film 11 from the side surface 9c and side surface 5c is suppressed.

Further, the method of production of the SAW device 1 has a first cutting step (FIG. 6B) of cutting the wafer 31, on the first main surface 5a of which a plurality of SAW elements 7 are provided, at the parts of the first main surface 5a sides by the first blade 41 so as to form groove portions 31a for partitioning the plurality of SAW devices 1. Further, this method of production has a second cutting step (FIG. 6D) of cutting the wafer 31 at parts of the second main surface 5b sides along the groove portions 31a by the second blade 45 having a thinner blade thickness than the first blade 41 so as to separate the wafer 31.

Accordingly, the protruding portions 5d can be simply formed. Further, blades which are different from each other are used in the two steps, therefore blades suitable for the steps can be used. For example, in the first cutting step (FIG. 6B), cutting is carried out at a high speed by cutting by the first blade 41 having the large particle size, while in the second cutting step (FIG. 6D), chipping, which easily occurs when a blade passes through a wafer, can be suppressed by cutting by the second blade 45 having a small particle size.

The method of production of the SAW device 1 further has a step (FIG. 6C) of filling resin in the groove portions 31a after the first cutting step (FIG. 6B) and before the second cutting step (FIG. 6D). Accordingly, the above-mentioned resin film 11 which covers the side surfaces 5c at the first main surface 5a side other than the protruding portion 5d and adheres to the protruding portion 5d can be simply constituted.

The method of production of the SAW device 1 further has a step (FIG. 5C) of forming the resin layer 15 on the second main surface 5b of the wafer 31 before the first cutting step (FIG. 6B). The resin layer 15 is not cut in the first cutting step (FIG. 6B), but the resin layer 15 is cut in the second cutting step (FIG. 6D). Accordingly, by selecting as the first blade 45 one suitable for cutting the piezoelectric substrate and as the second blade 45 selecting one suitable for cutting the resin layer 15, chipping and cracks in the second main surface 5b can be suppressed.

Figure 7A:
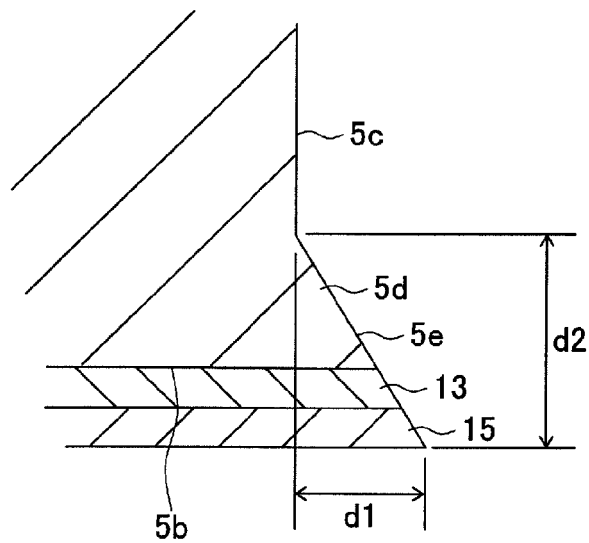
FIG. 7A to FIG. 7C are cross-sectional views showing protruding portions according to first to third modifications.
Figure 7B:
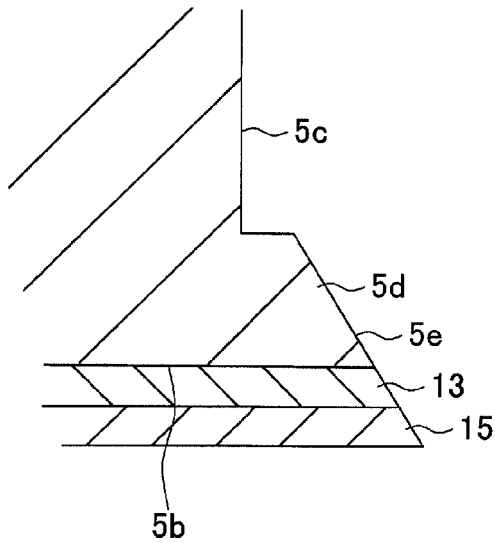
Figure 7C:
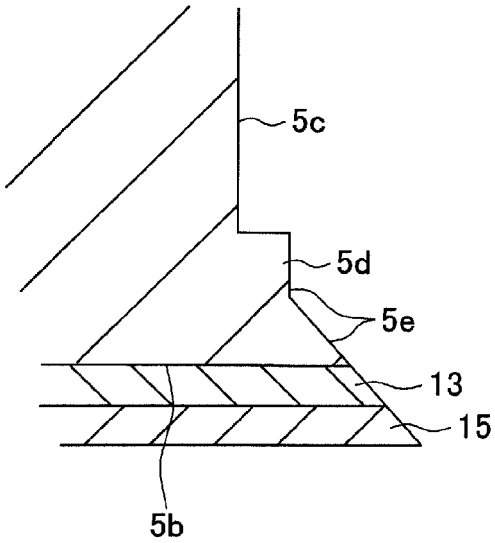

FIG. 7A to FIG. 7C are cross-sectional views showing first to third modifications of the protruding portion 5d. The protruding portions 5d of the first to third modifications are formed tapered so as to spread further outward toward the second main surface 5b side. In other words, the protruding portions 5d of the first to third modifications protrude out further the more toward the second main surface 5b sides (the closer in position to the second main surfaces 5b).

More specifically, in the first modification shown in FIG. 7A, the protruding portion 5d is formed so that its cross-sectional shape becomes a generally right triangle. In the second modification shown in FIG. 7B, the protruding portion 5d is formed so that its cross-sectional shape becomes generally trapezoidal. In the third modification shown in FIG. 7C, the protruding portion 5d is formed so that the cross-sectional shape of the part at the first main surface 5a side is generally rectangular (square) and the cross-sectional shape of the part at the second main surface 5b side is generally trapezoidal. The angle of inclination of the tapered surface (5e) of the protruding portion 5d relative to the side surface 5c (defined as 0° when the tapered surface is parallel to the side surface 5c) is for example 5° to 40°.

Note that, in the first to third modifications, the protruding portion 5d may be provided along the outer circumference of the second main surface 5b, the resin film 11 which abuts against the protruding portion 5d from the first main surface 5a side may be provided, and so on in the same way as the above embodiment.

The protruding portion 5d in the first modification can relieve stress concentration at the base of the protruding portion 5d at the first main surface 5a side compared with the protruding portion 5d in the above embodiment, while can cause the positions where impact occurs to concentrate at the second main surface 5b side. Further, compared with the protruding portion 5d in the above embodiment, the protruding portions 5d in the second and third modifications can cause the positions where impact occurs to concentrate at the second main surface 5b side. The protruding portions 5d in the first to third modifications can be formed by for example forming the entire second blade 45 or its outer circumferential edge to be tapered.

EXAMPLES

For the substrates 5 in the above embodiment and first modification, concrete dimensions etc. were set and simulations were performed concerning impact. Specifically, this was as follows:

Simulation Conditions
Basic dimensions of substrate 5
   Lx (see FIG. 2)=0.6 mm
   Ly (see FIG. 2)=0.8 mm
   Lz (see FIG. 2)=0.2 mm
Dimensions of protruding portion 5d
   d1 (see FIG. 2 and FIG. 7A)=0.0075 mm
   d2 (see FIG. 2 and FIG. 7A)=0.037 mm
Young's modulus of substrate 5: 230 GPa (assuming $LiTaO_3$)
Poisson's ratio of substrate 5: 0.3 (assuming $LiTaO_3$)
Density of substrate 5: 7450 kg/$m^3$ (assuming $LiTaO_3$)
Assumed situation: A situation was assumed where the substrate 5 was dropped in a Y-direction (see FIG. 2) and struck an XZ surface (surface perpendicular to Y-direction). A velocity at the time of impact of 3.2 m/s and an acceleration at the time of impact of 9.8 m/$s^2$ (gravitational acceleration) were assumed.

Computation Method
The finite element method was used to calculate the stress distribution in the substrate 5 in time sequence.

That is, when dropping the substrate 5 in the Y-direction, the protruding portion 5d impacts the XZ surface whereby stress is generated at the protruding portion 5d. This stress is propagated to the entire substrate 5 along with the elapse of time. This situation was reproduced and the stress of each part of the substrate 5 at each point of time was examined.

Evaluation Method
The maximum stress generated at the first main surface 5a was extracted.

Reason: This is because, as explained above, for maintenance of performance of the SAW device 1, it is considered that maintaining the shape of the part at the first main surface 5a side is more important than maintaining the shape of the part at the second main surface 5b side. Further, it is considered that the influence of the maximum value is greater than the mean value of stress.

Note that, the position of generation and point of time of generation in the first main surface 5a of the maximum stress which is generated in the first main surface 5a differ according to the simulation conditions.

Simulation Results
Case of the protruding portion 5d in the above embodiment
Maximum stress in first main surface 5a: $2.8 \times 10^8$ Pa
Case of protruding portion 5d in the first modification
Maximum stress in first main surface 5a: $2.5 \times 10^8$ Pa It was confirmed from the simulation results that the maximum value of stress generated in the first main surface 5a was smaller in the case where the protruding portion 5d was tapered so as to further protrude outward toward the second main surface 5b side than the case where the protruding portion 5d was rectangular.

The present invention is not limited to the above embodiment and modifications and may be executed in various ways.

The acoustic wave device is not limited to a SAW device. For example, the acoustic wave device may be a film bulk acoustic resonator. Further, the acoustic wave device may be a boundary acoustic wave device utilizing a boundary acoustic wave.

In the acoustic wave device, the resin film (11), back surface electrode (13), resin layer (15), and protective film (29) may be omitted. Conversely, other suitable layers etc. may be formed. Further, in the case of the boundary acoustic wave device, an acoustic wave device can be prepared without provision of vibration spaces S.

Further, the shape of the protruding portion 5d is not limited to the above explained ones. For example, the protruding portion 5d may be formed so as to gradually become broader from the first main surface 3a of the piezoelectric substrate 3 toward the second main surface 3b. In other words, the protruding portion 5d may be provided so that the shape of the piezoelectric substrate 3 becomes generally trapezoidal when viewing it from the side surface.

The cutting of the wafer is not limited to cutting carried out by using a blade. For example, the cutting may be carried out by using a laser. Further, a plurality of methods may be combined. For example, the first cutting step may be carried out by using a blade and the second cutting step may be carried out by using a laser.

Note that, in the SAW device, whether a side surface (5c) at the one main surface side (5a) other than the protruding portion (5d) and the surface (5e) of the protruding portion facing the side direction of the substrate are formed by surfaces cut by a blade can be identified by for example observation of the surfaces by an SEM (scanning electron microscope). For example, when a wafer is cut by a blade, straight (strictly speaking, arc-shaped) grooves which are formed by cutting by abrasive grains and are parallel to the main surface is formed in the side surface, therefore these grooves can be observed by the SEM.

The cutting in the second cutting step (FIG. 6D) need not be carried out from one main surface 5a side (side cut in the first cutting step) or may be carried out from the other main surface 5b side.

In the filling step (FIG. 6C) of resin which forms the resin film 11, the resin need not be filled up to the upper surface 9a of the cover 9. For example, the resin may be filled up to one main surface 5a of the substrate 5 or a part lower than it, or may be filled up to the upper face of the cover or a part lower than it.

REFERENCE SIGNS LIST

1 . . . SAW device (acoustic wave device), 5 . . . substrate, 5a . . . first main surface (one main surface), 5b . . . second main surface (other main surface), 5c . . . side surface, 5d . . . protruding portion, and 7 . . . SAW element (acoustic wave element).

The invention claimed is:

1. An acoustic wave device, comprising:
a substrate;
an acoustic wave element on one main surface of the substrate; and
a cover which is provided on the one main surface, is located at an inner side other than an outer circumference of the substrate, and seals the acoustic wave element,
wherein a side surface of the substrate comprises a protruding portion which protrudes out at a side of an another main surface closer than a side of the one main surface.

2. The acoustic wave device according to claim 1, further comprising:
a resin film which covers the side surface of the substrate at the part at the side of the one main surface other than the protruding portion, abuts against the protruding portion from the side of the one main surface, and is softer than the substrate.

3. The acoustic wave device according to claim 2, wherein the resin film is formed by a novolac-based resin, an epoxy resin, a Biphenol resin, or a Polyimide resin.

4. The acoustic wave device according to claim 2, further comprising a protective film on a third region of the one main surface of the substrate, the third region exposed from the cover, wherein the protective film abuts against the resin film.

5. The acoustic wave device according to claim 1, wherein when the side surface of the substrate is divided in a thickness direction into two regions comprising a first region at the side of the one main surface and a second region at the side of the another main surface, the protruding portion is provided in the second region.

6. The acoustic wave device according to claim 5, wherein the protruding portion is provided along an outer circumference of the another main surface and over the entire outer circumference.

7. The acoustic wave device according to claim 1, wherein the protruding portion is formed tapered to spread more outward toward a position near the another main surface.

8. The acoustic wave device according to claim 2, wherein a side surface of the cover is located at an inner side away from the side surface of the substrate and forms a step with the substrate, and wherein the resin film is provided and straddles the side surface of the cover from the side surface of the substrate and abuts against the step from the side of the one main surface.

9. The acoustic wave device according to claim 1, wherein:
protruding portion and the surface of the protruding portion facing the side direction of the substrate are cut surfaces formed by surfaces cut by a blade.

10. The acoustic wave device according to claim 1, wherein the cover comprises a frame surrounding the acoustic wave element and located at the inner side other than an outer circumference of the substrate.

11. The acoustic wave device according to claim 1, wherein the cover comprises a frame on the one main surface and a lid on the frame, and wherein the frame and the lid are located at the inner side other than an outer circumference of the substrate.

12. The acoustic wave device according to claim 1, wherein the cover comprises a frame on the one main surface and a lid on the frame, and wherein the frame and the lid are formed by a photosensitive resin.

13. The acoustic wave device according to claim 1, further comprising a protective film on a third region of the one main surface of the substrate, the third region exposed from the cover.

* * * * *